(12) United States Patent
Nishizawa (10) Patent No.: US 8,059,420 B2
(45) Date of Patent: Nov. 15, 2011

(54) SURFACE MOUNTABLE DEVICE

(75) Inventor: Yoshihiko Nishizawa, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1026 days.

(21) Appl. No.: 10/565,334

(22) PCT Filed: Jul. 16, 2004

(86) PCT No.: PCT/JP2004/010188
§ 371 (c)(1),
(2), (4) Date: Jan. 10, 2008

(87) PCT Pub. No.: WO2005/008698
PCT Pub. Date: Jan. 27, 2005

(65) Prior Publication Data
US 2007/0274055 A1 Nov. 29, 2007

(30) Foreign Application Priority Data

Jul. 22, 2003 (JP) .................. 2003-199968

(51) Int. Cl.
*H05K 7/00* (2006.01)
*H01R 9/00* (2006.01)

(52) U.S. Cl. ........ 361/760; 361/767; 361/768; 361/772; 361/773; 361/774; 174/260; 174/261; 174/262; 174/263

(58) Field of Classification Search .................. None
See application file for complete search history.

(56) References Cited

U.S. PATENT DOCUMENTS

| | | | | |
|---|---|---|---|---|
| 4,578,736 A | * | 3/1986 | Brown | 361/306.1 |
| 5,388,029 A | * | 2/1995 | Moriyama | 361/760 |
| 5,600,101 A | | 2/1997 | Sakai | |
| 5,625,935 A | | 5/1997 | Kubota et al. | |
| 5,805,423 A | * | 9/1998 | Wever et al. | 361/760 |
| 6,011,693 A | * | 1/2000 | Gore | 361/760 |
| 6,140,891 A | * | 10/2000 | Nakakubo et al. | 333/204 |
| 6,459,048 B1 | * | 10/2002 | Sakai et al. | 174/261 |
| 6,920,037 B2 | * | 7/2005 | Sano et al. | 361/540 |
| 7,193,862 B2 | * | 3/2007 | Maekawa et al. | 361/795 |

FOREIGN PATENT DOCUMENTS

| | | |
|---|---|---|
| JP | 2-305492 A | 12/1990 |
| JP | 06-053002 | 2/1994 |
| JP | 08-250620 | 9/1996 |
| JP | 10-170455 | 6/1998 |
| JP | 11-186092 | 7/1999 |
| JP | 2000-068148 | 3/2000 |

(Continued)

OTHER PUBLICATIONS

Official communication issued in counterpart Chinese Application No. 2004800010629, mailed on Jun. 27, 2008.

(Continued)

*Primary Examiner* — Boris Chervinsky
(74) *Attorney, Agent, or Firm* — Keating & Bennett, LLP (57) ABSTRACT

A surface mountable device includes a ceramic substrate including a first principal surface, a second principal surface, and a side surface connecting the first principal surface to the second principal surface, a terminal electrode disposed on the first principal surface, and a first conductor for appearance inspection extending continuously from the terminal electrode to the side surface and having a width smaller than the width of the terminal electrode.

16 Claims, 10 Drawing Sheets

FOREIGN PATENT DOCUMENTS

| | | |
|---|---|---|
| JP | 2001-85825 A | 3/2001 |
| JP | 2002-311486 A | 10/2002 |
| JP | 2002-359320 A | 12/2002 |

OTHER PUBLICATIONS

International Search Report for PCT Application No. PCT/JP2004/010188, mailed Nov. 9, 2004.

Official communication issued in counterpart Chinese Application No. 2004800010629, issued on Dec. 28, 2007.

Official communication issued in counterpart Chinese Application No. 200480001062.9, mailed on Mar. 6, 2009.

Official communication issued in counterpart Japanese Application No. 2005-511853, mailed on Dec. 18, 2007.

* cited by examiner

SURFACE MOUNTABLE DEVICE

BACKGROUND OF THE INVENTION

1. Field of the Invention

The present invention relates to a surface mountable device that is surface mounted on a motherboard such as a printed circuit board by, for example, soldering, and more specifically, to a surface mountable device in which the appearance of the bonding condition with the motherboard can be visually inspected.

2. Description of the Related Art

Figure 16:
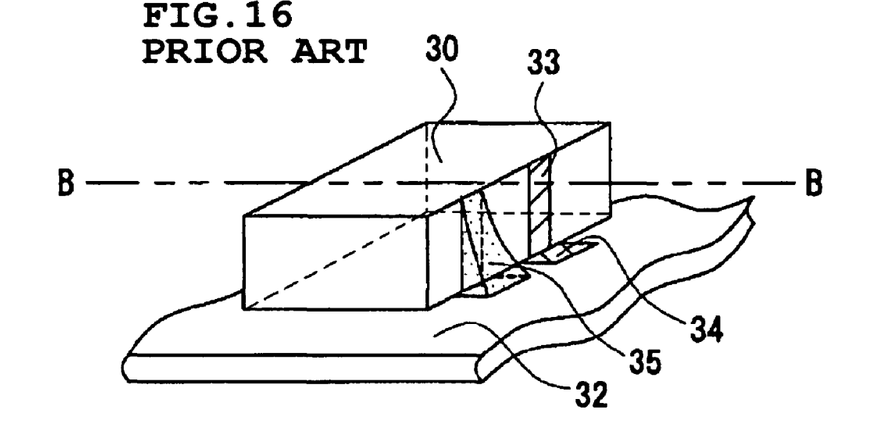
FIG. 16 is a perspective view showing the state after a known surface mount device including electrodes at the side surface is mounted on a motherboard.
Figure 17:
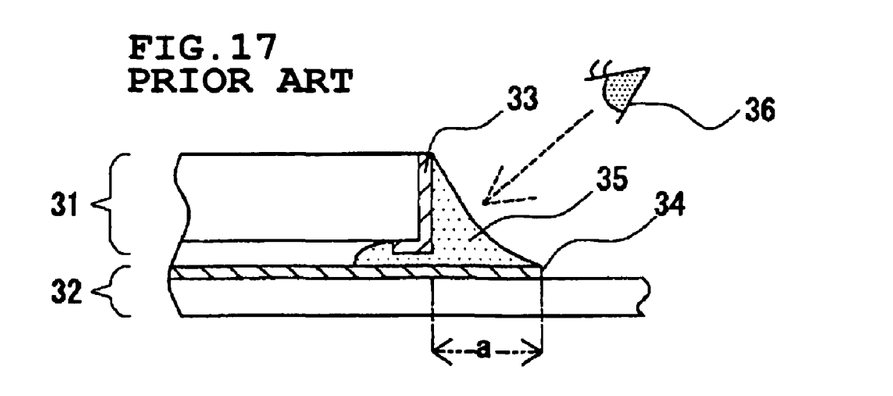
FIG. 17 is a cross-sectional view showing the state after the surface mount device shown in FIG. 16 is mounted on the motherboard.

FIGS. 16 to 19 show examples of the structure of known surface mount devices. FIG. 16 is a perspective view showing a state in which a surface mount device 30 including side electrodes 33 disposed at the side surface of the substrate is mounted on a motherboard 32 (a mount board for a device) by soldering. FIG. 17 is a cross-sectional view taken along imaginary cutting line B-B in FIG. 16. Land electrodes 34 of the motherboard 32 for mounting the surface mount device 30 are generally arranged so as to be exposed from the side surface of the surface mount device 30 toward the outside by a width a. Thus, the land electrodes 34 are intentionally exposed from the side surface toward the outside in order to form solder 35 having a certain thickness at the side surface of the surface mount device 30. This structure increases the peel strength of the surface mount device 30.

Figure 18:
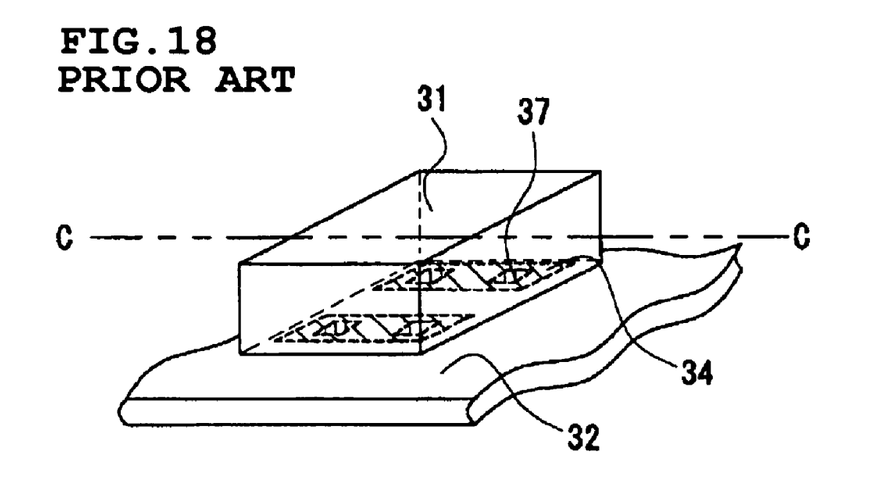
FIG. 18 is a perspective view showing the state after a known surface mount device including electrodes at the bottom surface is mounted on a motherboard.
Figure 19:
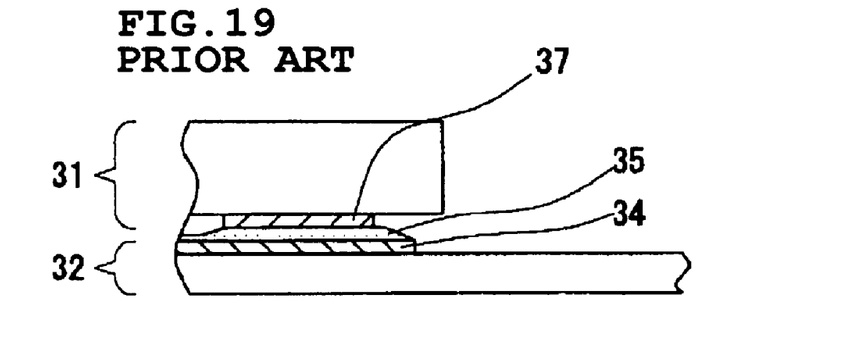
FIG. 19 is a cross-sectional view showing the state after the surface mount device shown in FIG. 18 is mounted on the motherboard.

FIG. 18 is a perspective view showing a state in which a surface mount device 31 including terminal electrodes 37 disposed at the bottom surface of the substrate is mounted on a motherboard 32 by soldering. For example, as disclosed in Japanese Unexamined Patent Application Publication No. 8-250620 (hereinafter referred to as "Patent Document 1"), a surface mount device including external connection electrodes in a ball grid array (BGA) structure corresponds to such a surface mount device. FIG. 19 is a cross-sectional view taken along imaginary cutting line C-C in FIG. 18. Land electrodes 34 of the motherboard 32 for mounting the surface mount device 31 are generally disposed at the inside so as not to be exposed from the side surface of the surface mount device 31 to the outside. In this structure, solder 35 is not exposed from the side surface of the surface mount device 31 toward the outside, thereby improving the packaging density of the motherboard 32. Recently, downsizing has been highly desired, and the surface mount devices shown in FIG. 18 in which terminal electrodes are disposed at the bottom surface of the substrate has become desirable.

For both of these types of surface mount devices, such as electronic components, after the surface mount devices are mounted on a motherboard, the appearance is inspected to confirm the solderability. Regarding the surface mount device 30 shown in FIG. 16, the appearance can be checked by visual inspection 36 because the solder 35 is provided outside of the surface mount device 30. On the other hand, with the surface mount device 31 shown in FIG. 18, the appearance cannot be thoroughly checked by visual inspection because the solder 35 is provided in a narrow clearance between the surface mount device 31 and the motherboard 32. Consequently, Japanese Unexamined Patent Application Publication No. 10-170455 (hereinafter referred to as "Patent Document 2") discloses a method for inspecting the appearance by X-ray transmission.

However, even if the method for inspecting the appearance described in Patent Document 2 can be applied to the surface mount device 31 shown in FIG. 18, the method cannot be easily applied to the actual manufacturing process in terms of the cost because a transmission apparatus required for the appearance inspection by X-ray transmission is expensive.

SUMMARY OF THE INVENTION

To solve the problems described above, preferred embodiments of the present invention provide a surface mount device in which the appearance of the bonding state, such as the solderability of the surface mount device, can be readily checked by visual inspection even when a solder fillet having a certain thickness is not formed on the external surface of the surface mount device and even when a special transmission apparatus is not used.

A surface mount device according to a preferred embodiment of the present invention includes a substrate including a first principal surface, a second principal surface, and a side surface connecting the first principal surface to the second principal surface; a terminal electrode disposed on the first principal surface; and a first conductor for appearance inspection extending continuously from the terminal electrode to the side surface and having a width that is less than the width of the terminal electrode.

The surface mount device preferably further includes a second conductor for appearance inspection disposed on the side surface of the substrate, the second conductor for appearance inspection being continuous from the extended end of the first conductor for appearance inspection.

The width of the first conductor for appearance inspection is preferably about 100 μm or less. The first conductor for appearance inspection preferably extends from the terminal electrode to the inside of the substrate.

Preferably, at least two first conductors for appearance inspection are disposed continuously at the single terminal electrode. The at least two first conductors for appearance inspection are preferably disposed continuously at both ends of the terminal electrode.

As described above, the surface mount device according to preferred embodiments of the present invention includes a substrate having a first principal surface, a second principal surface, and a side surface connecting the first principal surface to the second principal surface, a terminal electrode disposed on the first principal surface, and a first conductor for appearance inspection extending continuously from the terminal electrode to the side surface and having a width smaller than the width of the terminal electrode.

In other words, the terminal electrode disposed on the first principal surface (i.e., mounting surface) is connected to a land electrode disposed on the surface of a motherboard, such as a printed circuit board, with a bonding material such as solder. The first conductor for appearance inspection extends continuously from the terminal electrode. Therefore, when the surface mount device is connected with the motherboard, the bonding material is applied from the space between the terminal electrode on the mounting surface and the land electrode in the upward direction along the first conductor for appearance inspection disposed on the side surface. As a result, the presence of the bonding material that is applied upward on the first conductor for appearance inspection can be checked by visual inspection. Thus, the appearance of the bonding state of the surface mount device can be readily inspected.

The width of the first conductor for appearance inspection is less than, in particular, less than about one third of, the width of the terminal electrode disposed on the mounting surface. Accordingly, the amount of bonding material, such as the solder, applied upward on the first conductor for appearance inspection is minimized. In addition, the dimension of the bonding material applied upward from the terminal electrode can be increased. For example, the width of the first conductor for appearance inspection is preferably about 100 μm or less, and more preferably, about 80 μm or less. When the width of the first conductor for appearance inspection is about 100 μm or less, the amount of bonding material, such as the solder, applied upward can be increased by capillary effect.

Preferably, the second conductor for appearance inspection is disposed along the side surface of the substrate and extends continuously from the extended end of the first conductor for appearance inspection. Furthermore, the second conductor for appearance inspection preferably extends in the width direction of the first conductor for appearance inspection. The second conductor for appearance inspection is disposed in a direction further extending from the width of the first conductor for appearance inspection. Therefore, the bonding material applied upward on the first conductor for appearance inspection further extends in the width direction along the second conductor for appearance inspection. As a result, the bonding material applied upward can be visually inspected more reliably.

The first conductor for appearance inspection is preferably disposed such that at least one end of the terminal electrode disposed on the bottom surface of the substrate extends continuously to the inside of the substrate and the extended end is disposed at the inside of the substrate. A continuous end surface defined by the terminal electrode and the first conductor for appearance inspection is exposed as a portion of the side surface of the substrate. The first conductor for appearance inspection may be defined by extending both ends of the terminal electrode from the bottom surface of the substrate to the inside of the substrate. In such a case, two first conductors for appearance inspection are provided at both ends of the terminal electrode.

Although the substrate is not particularly limited, a multilayer substrate including a plurality of laminated insulating layers is preferable. The insulating layers are composed of, for example, ceramic layers or resin layers, such as epoxy resin layers. The ceramic layers used for the insulating layers are preferably prepared by firing a low temperature co-fired ceramic (LTCC) material. The LTCC material can be fired at about 1,000° C. or less and can be concurrently fired with, for example, silver or copper having a small specific resistance. Examples of the LTCC material include glass composite LTCC materials prepared by mixing a ceramic powder composed of, for example, alumina or forsterite with borosilicate glass; crystallized glass LTCC materials using crystallized glass composed of $ZnO$—$MgO$—$Al_2O_3$—$SiO_2$; and non-glass LTCC materials using a ceramic powder composed of, for example, $BaO$—$Al_2O_3$—$SiO_2$ or $Al_2O_3$—$CaO$—$SiO_2$—$MgO$—$B_2O_3$, and other suitable LTCC materials.

Regarding the terminal electrode, when the insulating layers are resin layers, for example, a metal foil, such as a copper foil, is preferably used. When the insulating layers are ceramic layers composed of an LTCC material, for example, a conductive paste primarily composed of silver or copper is preferably used.

Preferred embodiments of the present invention provide a surface mount device in which the appearance of the bonding state, such as the solderability of the surface mount device, can be readily checked by visual inspection even when, for example, a solder fillet having a certain thickness is not disposed on the external surface of the surface mount device, and even when a special transmission apparatus is not used.

Other features, elements, steps, characteristics and advantages of the present invention will become more apparent from the following detailed description of preferred embodiments with reference to the attached drawings.

DETAILED DESCRIPTION OF PREFERRED EMBODIMENTS

Preferable embodiments of the surface mount device of the present invention will now be described with reference to FIGS. 1 to 15.

First Preferred Embodiment

Figure 1:
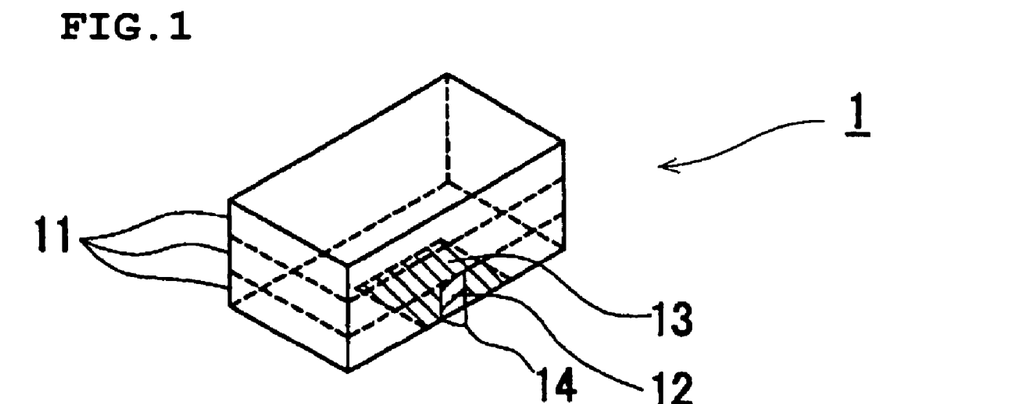
FIG. 1 is a perspective view showing a preferred embodiment of a surface mount device of the present invention.

FIG. 1 is a perspective view of a surface mount device according to a first preferred embodiment. A surface mount device 1 of this preferred embodiment is preferably composed of, for example, a substantially rectangular ceramic multilayer substrate having a first principal surface, a second principal surface, and four side surfaces connecting the first principal surface to the second principal surface. The multilayer substrate includes three laminated ceramic layers 11 each of which has a thickness of about 100 µm.

A terminal electrode 13 is disposed at the first principal surface (bottom surface) of the ceramic multilayer substrate. A first conductor 12 for appearance inspection that extends substantially perpendicular to the bottom surface is disposed on at least one of the four side surfaces of the ceramic multilayer substrate. The first conductor 12 for appearance inspection extends from the terminal electrode 13 along the side surface and is continuous with the terminal electrode 13 in the vicinity of the edge between the bottom surface and the side surface of the undermost ceramic layer.

The first conductor 12 for appearance inspection has a width 14 of as narrow as about 80 µm. The first conductor 12 for appearance inspection has a height of about 100 µm, which is the same as the thickness of one ceramic layer. The terminal electrode has a width (width in the same direction as the direction of the width of the first conductor 12 for appearance inspection) of about 240 µm. A plated gold film is formed by electroless plating on the surfaces of the first conductor 12 for appearance inspection and the terminal electrode 13 to improve the wettability of the solder. In order to achieve a high density arrangement and to provide sufficient connection reliability on a motherboard, the width of the terminal electrode 13 is preferably about 100 µm to about 1.5 mm, and more preferably, about 200 µm to about 700 µm.

Figure 2:
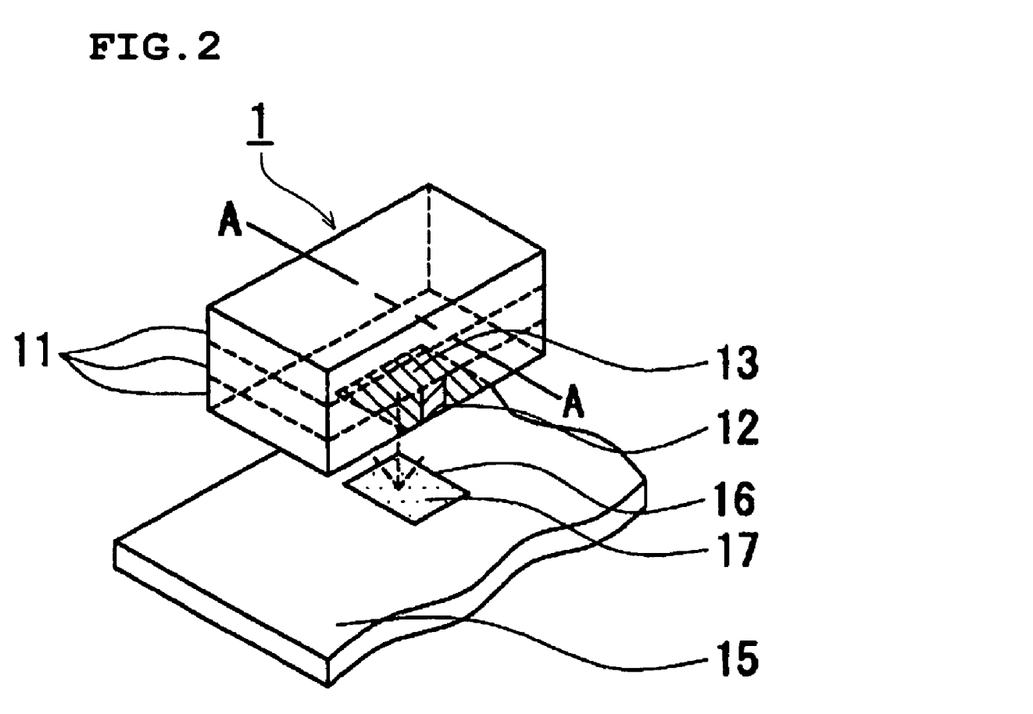
FIG. 2 is a perspective view showing the state immediately before the surface mount device shown in FIG. 1 is mounted on a motherboard.

FIG. 2 is a perspective view showing the state immediately before the surface mount device 1 shown in FIG. 1 is mounted on a motherboard 15. A plated gold film is disposed on the surface of a land electrode 16 of the motherboard 15. Furthermore, a solder film 17 is printed on the gold film. The surface mount device 1 is positioned on such a motherboard 15. Subsequently, all the components are heated to melt the solder film 17 on the land electrode 16. The terminal electrode 13 of the surface mount device 1 is connected to the land electrode 16 of the motherboard 15 in order to mount the surface mount device 1 on the motherboard 15. In this step, the surface mount device 1 is mounted such that the side surface of the surface mount device 1 is aligned with the edge of the land electrode 16 and the land electrode 16 is not exposed from the side surface of the surface mount device 1.

Figure 3:
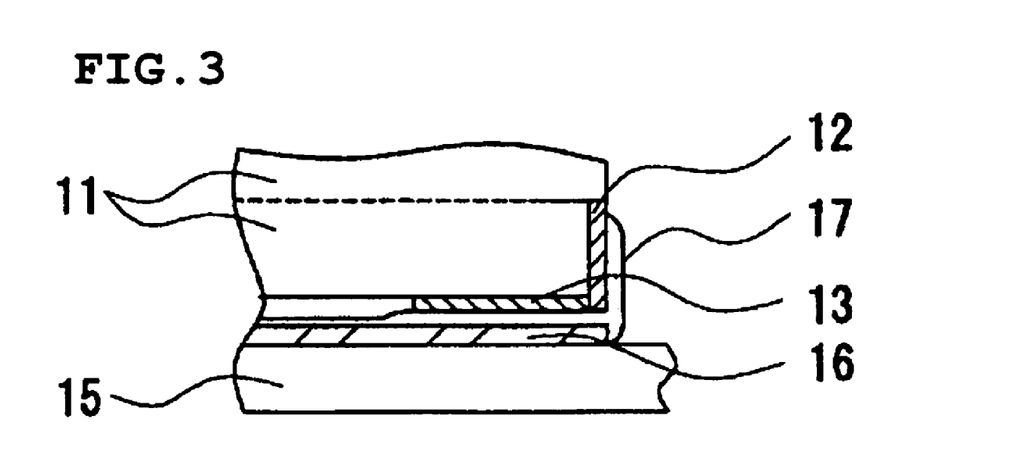
FIG. 3 is a cross-sectional view showing the state after the surface mount device shown in FIG. 1 is mounted on the motherboard.

FIG. 3 is a cross-sectional view of the surface mount device 1 and the motherboard 15 after mounting taken along imaginary cutting line A-A in FIG. 2. As shown in FIG. 3, the solder film 17 crosses the edge between the bottom surface and the side surface of the ceramic multilayer substrate and is thinly applied upward in the vicinity of the upper end of the first conductor 12 for appearance inspection. Unlike a typical side electrode, the first conductor 12 for appearance inspection is narrow and has a small size, that is, the first conductor 12 for appearance inspection has a width 14 of about 100 µm and a height of about 100 µm. Therefore, even when the small amount of the solder film 17 for connecting the terminal electrode 13 is printed, the solder film 17 can be applied upward in the vicinity of the upper end of the conductor 12 for appearance inspection.

Figure 4:
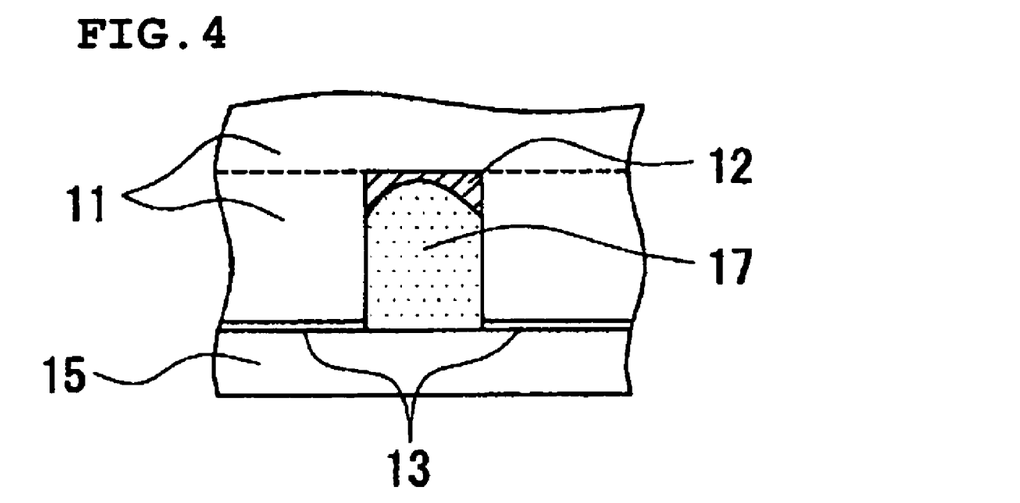
FIG. 4 is an enlarged side view of the relevant part of the surface mount device shown in FIG. 1 after the surface mount device is mounted on the motherboard.

FIG. 4 is an enlarged view of the surface mount device 1 after mounting, visually viewed from the side surface on which the first conductor 12 for appearance inspection is disposed. As shown in FIG. 4, the solder film 17 is applied from the terminal electrode 13 side and is applied upward along the first conductor 12 for appearance inspection that is disposed substantially perpendicular to the bottom surface of the ceramic multilayer substrate and has the plated gold film disposed thereon. The first conductor 12 for appearance inspection is gold due to the plated gold film, whereas the solder film 17 is silver. Accordingly, the application of the solder film 17 in the upward direction is readily distinguished as a result of the difference in the color of the components. Thus, the presence of the solder can be readily checked by visual inspection. Furthermore, since the first conductor 12 for appearance inspection substantially has an upright rectangular shape, the application in the upward direction can be readily determined with respect to the height of the solder. Thus, in the appearance inspection, the degree of solderability can be estimated by checking the wetting of the solder in the upward direction.

In the present preferred embodiment, the first conductor 12 for appearance inspection has a height of about 100 µm, for example. The height is not limited to this height as long as the appearance of soldering can be checked by visual inspection. For example, the height of the first conductor 12 for appearance inspection is preferably about 5 µm to about 200 µm, and more preferably, about 20 µm to about 100 nm.

FIGS. 5A-5D includes perspective views showing an example of a process for producing the surface mount device of the present preferred embodiment. The process will now be described with reference to FIGS. 5A-5D.

Figure 5A:
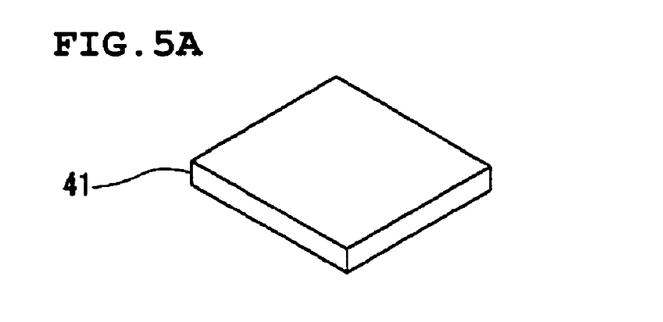
FIGS. 5(A) to 5(D) are perspective views showing a process for producing the surface mount device shown in FIG. 1.

Firstly, as shown in FIG. 5(A), a ceramic green sheet 41 is prepared. A large ceramic green sheet is generally used in mass production in order to produce many devices at one time. In this preferred embodiment, however, in order to simplify the description of the process, a ceramic green sheet having two sub-substrates is prepared.

Figure 5B:
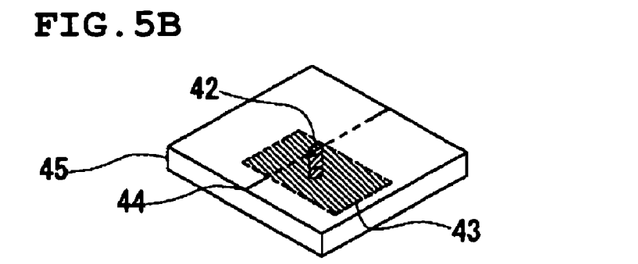

As shown in FIG. 5(B), a ceramic green sheet 45, which is disposed at the bottom of a master substrate, is prepared. This ceramic green sheet 45 has the same dimensions as those of the ceramic green sheet 41 shown in FIG. 5(A). A through hole having a diameter of about 100 µm or less is preferably formed in the ceramic green sheet 45, such that the center of the through hole is disposed on a sub-substrate parting line 44. A paste primarily composed of silver or copper is filled in the through hole to form a filled via 42. Furthermore, a conductor film 43, which forms a terminal electrode, is printed so as to cover the filled end of the filled via 42, the filled end being exposed at the lower surface of the ceramic green sheet 45. In addition, the conductor film 43 extends equally to both sides over the sub-substrate parting line 44. As required, a conductor film forming an internal circuit layer or a via conductor is formed on the other ceramic green sheets 41 to be laminated.

Figure 5C:
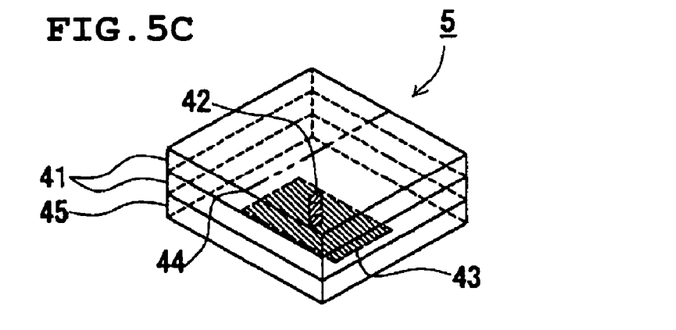

Subsequently, as shown in FIG. 5(C), the ceramic green sheet 45 is disposed at the bottom such that the conductor film 43 is disposed at the lower surface. Other ceramic green sheets 41 are laminated on the ceramic green sheet 45 in a desired order. All of the ceramic green sheets are press bonded to form a master laminated product 5. The master laminated product 5 includes the conductor film 43 disposed at the bottom thereof.

The master laminated product 5 is fired at an appropriate firing temperature. The resultant fired ceramic product is then divided into two portions along the sub-substrate parting line 44 shown in FIG. 5(C) to form two sub-substrates shown in FIG. 5(D). This division also divides the small filled via 42 in half to expose the conducting surface on the side surface of each sub-substrate. This exposed conducting surface forms the first conductor 12 for appearance inspection in the surface mount device 1.

Figure 5D:
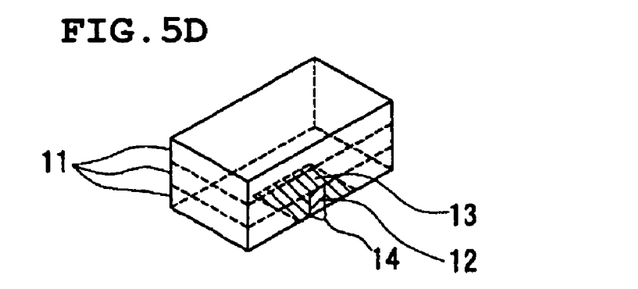

Subsequently, electronic components, such as a semiconductor device and a monolithic capacitor chip, are mounted on the sub-substrate (ceramic multilayer substrate). Furthermore, for example, these electronic components are covered with a metal case so as to form the surface mount device 1. When the surface mount device 1 is mounted on the motherboard, the solder film 17 is applied upward on the first conductor 12 for appearance inspection formed on the side surface. The mounting of the surface mount device 1 on the motherboard can be checked by visual inspection of the solder film 17 applied upward. Unlike the known technologies, according to preferred embodiments of the present invention, even when, for example, a solder fillet having a certain thickness is not formed on the external surface of the surface mount device 1, and even when a special transmission apparatus is not used, the bonding state of the surface mount device 1 by soldering can be readily checked by visual inspection of the solder film 17 applied upward on the first conductor 12 for appearance inspection. In addition, according to preferred embodiments of the present invention, a large solder fillet is not required, thereby increasing the packaging density of the surface mount device 1.

Second Preferred Embodiment

Figure 6:
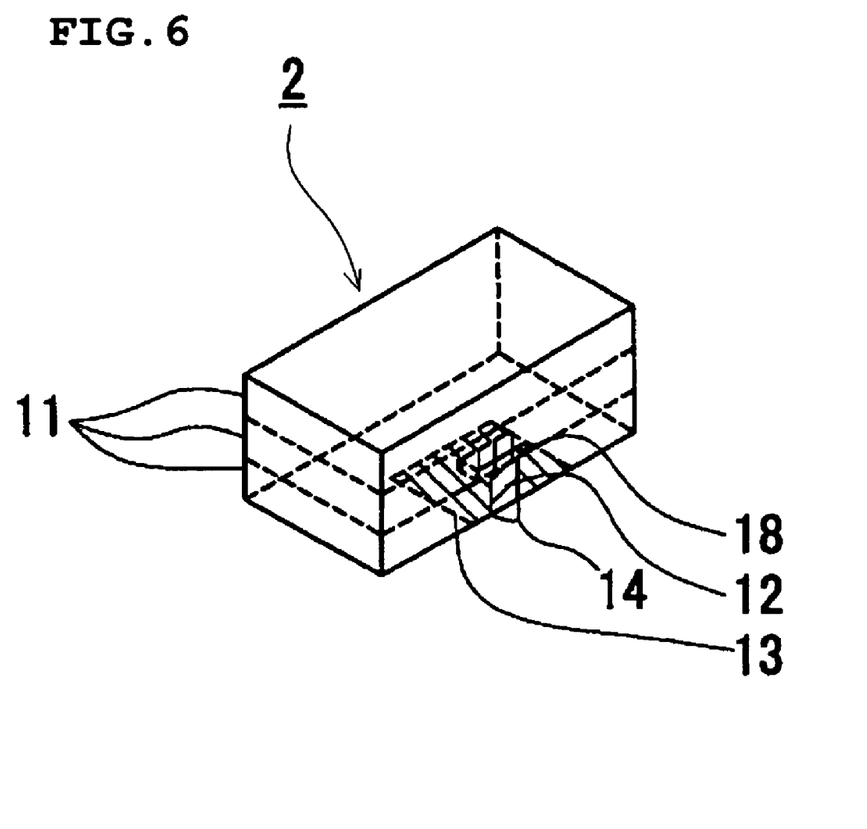
FIG. 6 is a perspective view showing another preferred embodiment of a surface mount device of the present invention.

FIG. 6 is a perspective view of a surface mount device of the present preferred embodiment. In the description of this preferred embodiment, components that are the same as or correspond to those in the first preferred embodiment have the same reference numerals. In addition to a first conductor 12 for appearance inspection, a surface mount device 2 of the present preferred embodiment includes a second conductor 18 for appearance inspection. Other parts are preferably formed according to the first preferred embodiment.

In this preferred embodiment, the second conductor 18 for appearance inspection extends from the upper extended end of the first conductor 12 for appearance inspection. The second conductor 18 for appearance inspection is a conductor film having an elongated shape and is disposed in the direction substantially parallel to the bottom surface of the ceramic multilayer substrate. The second conductor 18 for appearance inspection is disposed continuously at the upper end of the first conductor 12 for appearance inspection. The combination of the first and the second conductors 12 and 18 for appearance inspection substantially forms a T shape. The dimension of the second conductor 18 for appearance inspection in the horizontal direction is preferably, for example, about 100 μm to about 300 μm, which is greater than the width of the first conductor 12 for appearance inspection. The thickness (dimension in the height direction) of the second conductor 18 for appearance inspection is preferably about 3 μm to about 50 μm. The width and the height of the first conductor 12 for appearance inspection are preferably the same as those in the first preferred embodiment.

Figure 7:
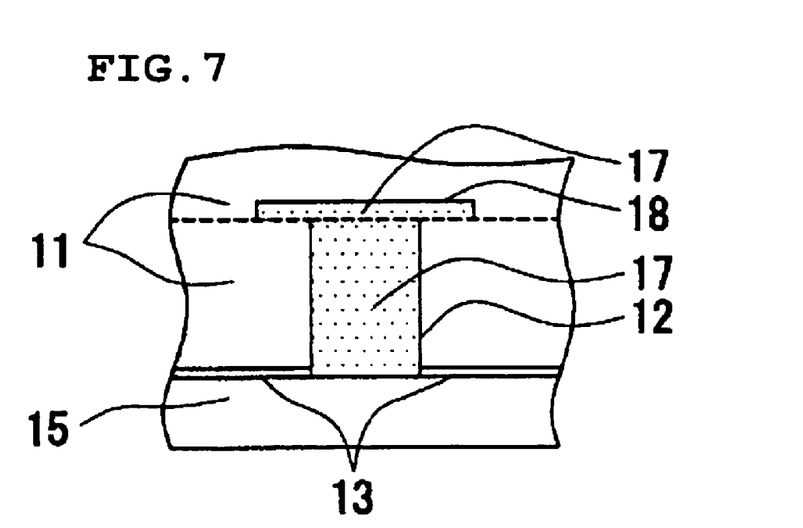
FIG. 7 is an enlarged side view of the relevant part of the surface mount device shown in FIG. 6 after the surface mount device is mounted on a motherboard.

FIG. 7 is an enlarged view of the surface mount device 2 after the surface mount device 2 is mounted on a motherboard 15, visually viewed from the side surface on which the first and the second conductors 12 and 18 for appearance inspection are provided. In this preferred embodiment, as shown in FIG. 7, the first and the second conductors 12 and 18 for appearance inspection substantially form the T shape. Accordingly, when a solder film 17 is applied upward on the first conductor 12 for appearance inspection, as shown in the FIG. 7, the solder film 17 is further applied on the entire length in the horizontal direction of the second conductor 18 for appearance inspection. In this preferred embodiment, since the solder film 17 expands into the T shape, the degree of wetting of the solder in the upward direction can be visually distinguished more clearly, as compared to the first preferred embodiment including only the upright rectangular shape.

FIGS. 8A-8E includes perspective views showing an example of a process for producing the surface mount device of the present preferred embodiment. The process will now be described with reference to FIGS. 8A-8E.

Figure 8A:
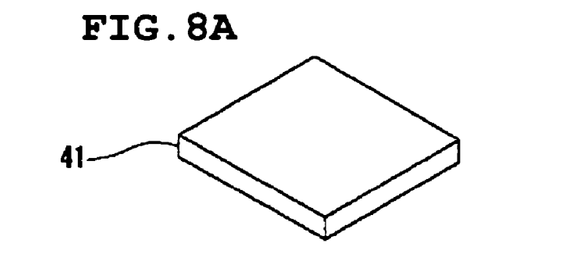
FIGS. 8(A) to 8(E) are perspective views showing a process for producing the surface mount device shown in FIG. 6.

Firstly, as shown in FIG. 8(A), a ceramic green sheet 41 is prepared. In order to simplify the description of the process, a ceramic green sheet 41 having two sub-substrates is prepared as in the first preferred embodiment.

Figure 8B:
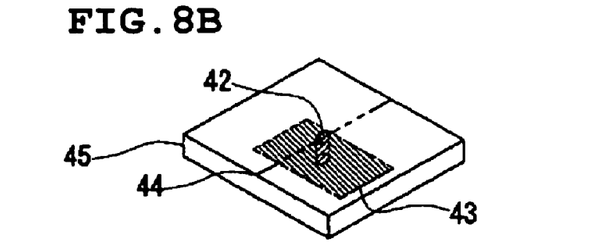

As shown in FIG. 8(B), a ceramic green sheet 45, which is disposed at the bottom of a master substrate, is prepared and a filled via 42 is formed in the ceramic green sheet 45 as in the first preferred embodiment. Furthermore, a conductor film 43, which forms a terminal electrode, is printed so as to cover the filled end of the filled via 42, the filled end being exposed at the lower surface of the ceramic green sheet 45. In addition, the conductor film 43 extends equally to both sides over a sub-substrate parting line 44. As required, a conductor film forming an internal circuit layer or a via conductor is formed on another ceramic green sheet 41 to be laminated.

Figure 8C:
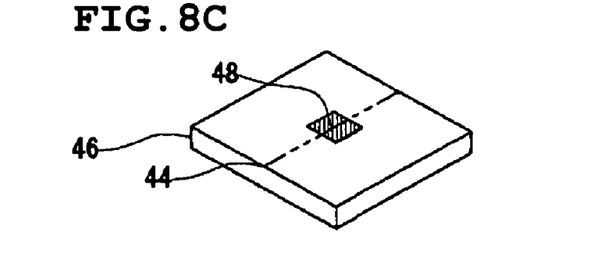

As shown in FIG. 8(C), a conductor film 48, which forms the second conductor for appearance inspection, is then printed on a ceramic green sheet 46. The conductor film 48 extends equally to both sides over the sub-substrate parting line 44. The dimension of the conductor film 48 in the direction of the sub-substrate parting line is about 200 μm, for example, which is greater than the diameter of the filled via 42. The thickness of the conductor film 48 is about 10 μm, for example.

Figure 8D:
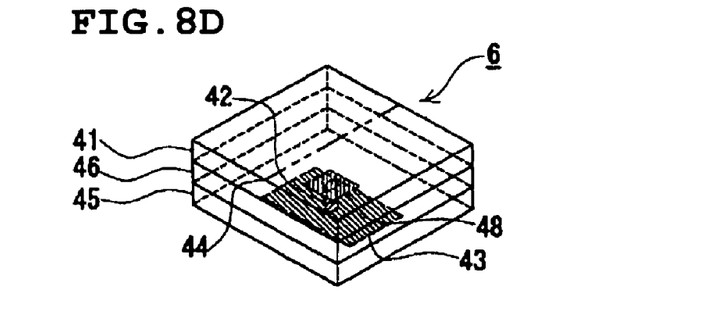

Subsequently, the ceramic green sheet 45 is disposed at the bottom as in the first preferred embodiment. The ceramic green sheet 46 is laminated on the ceramic green sheet 45, such that the conductor film 48 is disposed at the lower surface. Another ceramic green sheet 41 is laminated in a desired order. All of the ceramic green sheets are press bonded to form a master laminated product 6. As shown in FIG. 8(D), in the master laminated product 6, the conductor film 43 is disposed at the bottom, the conductor film 48 is disposed on the upper surface of the undermost ceramic green sheet 45, and the conductor film 43 and the conductor film 48 are connected through the filled via 42.

The master laminated product 6 is fired at a predetermined firing temperature. The resultant fired ceramic product is then divided into two portions along the sub-substrate parting line 44 shown in FIG. 8(D) to form two sub-substrates shown in FIG. 8(E). This division also divides the small filled via 42 in half to expose the conducting surface on the side surface of each sub-substrate. This exposed conducting surface forms the first and second conductors 12 and 18 for appearance inspection.

Figure 8E:
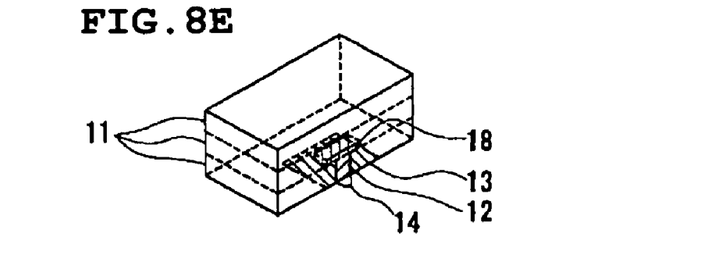

Subsequently, electronic components, such as a semiconductor device and a monolithic capacitor chip, are mounted on the sub-substrate (ceramic multilayer substrate). Furthermore, for example, these electronic components are covered with a metal case so as to form the surface mount device 2. When the surface mount device 2 is mounted on the motherboard, the solder film 17 is applied upward to the second conductor 18 for appearance inspection through the first conductor 12 for appearance inspection formed on the side surface. The mounting of the surface mount device 1 on the motherboard can be more accurately checked by the solder film 17 applied over the second conductor 18 for appearance inspection, as compared to the first preferred embodiment.

Third Preferred Embodiment

Figure 9:
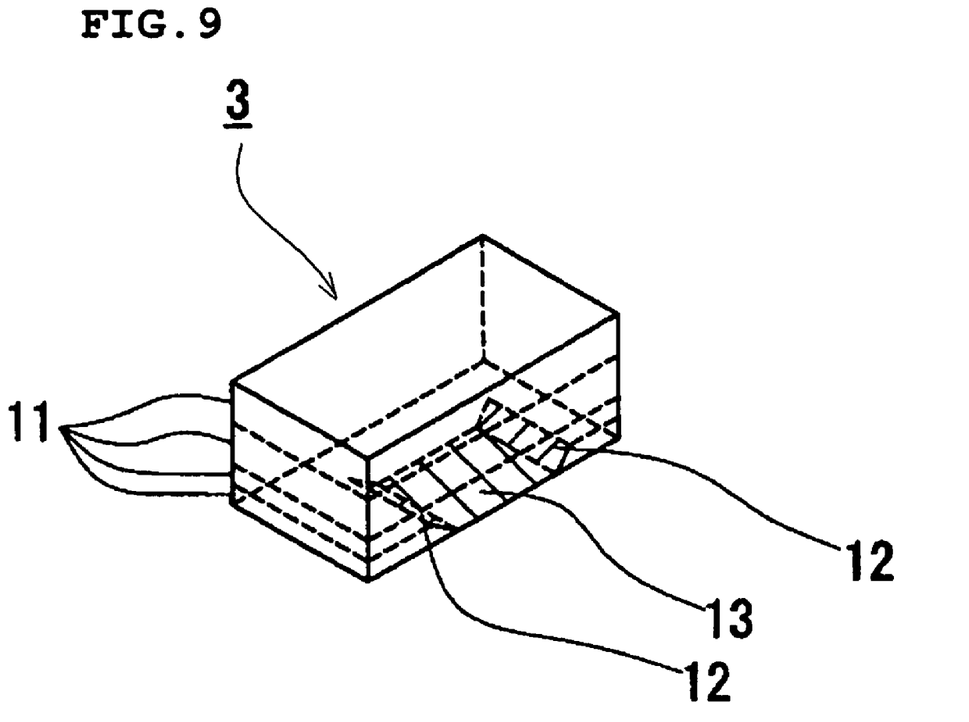
FIG. 9 is a perspective view showing another preferred embodiment of a surface mount device of the present invention.

FIG. 9 is a perspective view of a surface mount device of the present preferred embodiment. In the description of this preferred embodiment, components that are the same as or correspond to those in the above described preferred embodiments have the same reference numerals.

As shown in FIG. 9, in a surface mount device 3 of this preferred embodiment, both ends of a terminal electrode 13 disposed at the bottom surface of a ceramic multilayer substrate extend upward to the inside of the ceramic multilayer substrate. The bent end surfaces are exposed on the side surface of the ceramic multilayer substrate so as to define first conductors for appearance inspection. Other parts are formed according to the preferred embodiments described above. A plated gold film is formed on the first conductors 12 for appearance inspection as in the first preferred embodiment. Subsequently, the surface mount device 3 is mounted on a motherboard as in FIG. 2 in the first preferred embodiment.

Figure 10:
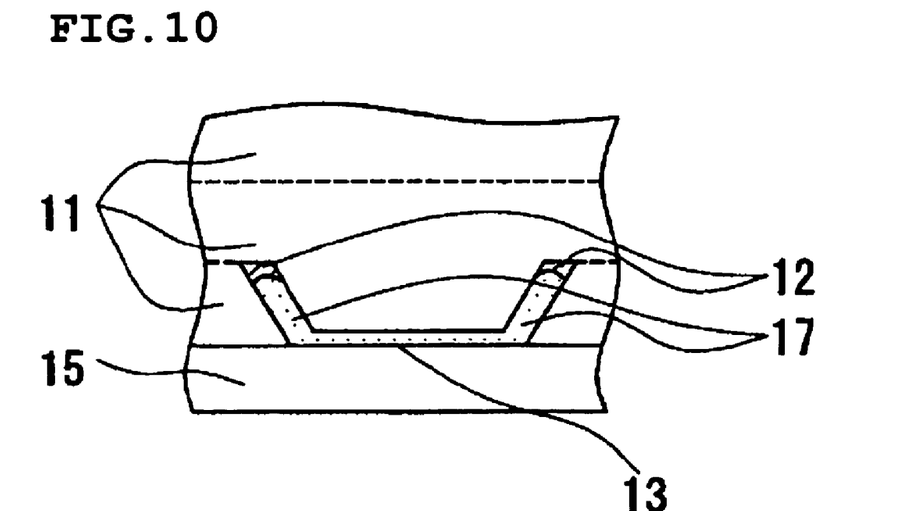
FIG. 10 is an enlarged side view of the relevant part of the surface mount device shown in FIG. 9 after the surface mount device is mounted on a motherboard.

FIG. 10 is an enlarged view of the surface mount device 3 after the surface mount device 3 is mounted on a motherboard 15, visually viewed from the side surface on which the first conductors 12 for appearance inspection are provided. In this preferred embodiment, both ends of the terminal electrode 13 disposed at the bottom surface of the ceramic multilayer substrate extend to the inside of the ceramic multilayer substrate so as to provide slanted portions. The slanted portions are exposed on the side surface of the ceramic multilayer substrate and define the first conductors 12 for appearance inspection. Thus, the first conductors 12 for appearance inspection are provided continuously at both ends of the terminal electrode 13. As a result, the bonding state between the surface mount device 3 and the motherboard can be more reliably checked. The structure of the surface mount device is not limited to this preferred embodiment. At least three first conductors 12 for appearance inspection may be provided continuously at one terminal electrode 13.

FIGS. 11A-11E includes perspective views showing an example of a process for producing the surface mount device of the present preferred embodiment. The process will now be described with reference to FIGS. 11A-11E.

Figure 11A:
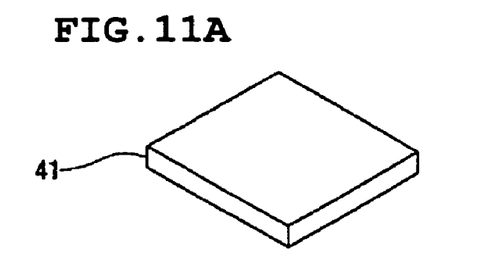
FIGS. 11(A) to 11(E) are perspective views showing a process for producing the surface mount device shown in FIG. 9.

Firstly, as shown in FIG. 11(A), a ceramic green sheet 41 is prepared. In order to simplify the description of the process, a ceramic green sheet 41 having two sub-substrates is prepared as in the first preferred embodiment.

Figure 11B:
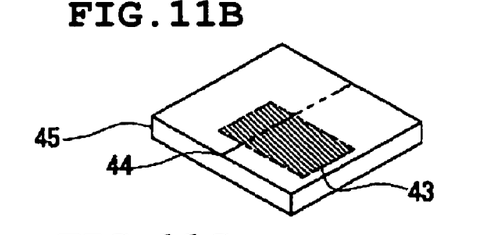

As shown in FIG. 11(B), a ceramic green sheet 45, which is disposed at the bottom of a master substrate, is prepared. A conductor film 43 that forms a terminal electrode is printed on the ceramic green sheet 45, such that the conductor film 43 extends equally to both sides over a sub-substrate parting line 44. As required, a conductor film forming an internal circuit layer or a via conductor is formed on the other ceramic green sheets 41 to be laminated.

Figure 11C:
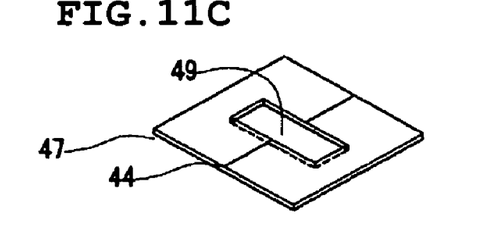

Subsequently, as shown in FIG. 11(C), a ceramic green sheet 47 for embedding both ends of the conductor film 43 is prepared. The ceramic green sheet 47 includes an opening 49 having a width that is less than that of the conductor film 43.

Figure 11D:
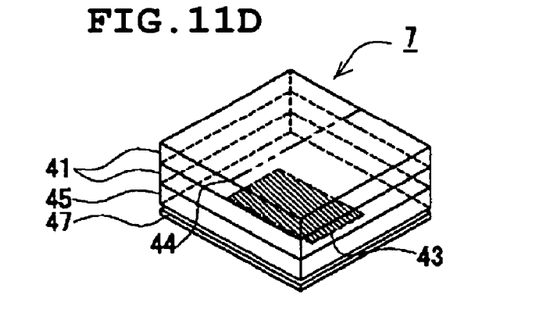

Subsequently, as shown in FIG. 11(D), the ceramic green sheet 47 is disposed at the bottom. The ceramic green sheet 45 is laminated on the ceramic green sheet 47. Other ceramic green sheets 41 are laminated on the ceramic green sheet 45 in a desired order. The ceramic green sheet 45 is disposed such that the surface on which the conductor film 43 is printed faces the ceramic green sheet 47. In this step, both ends of the conductor film 43 overlap the ceramic green sheet 47.

Figure 12:
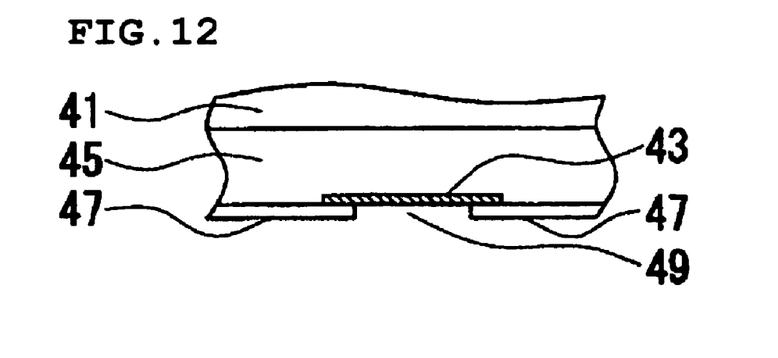
FIG. 12 is a cross-sectional view showing the state in which a master laminated product shown in FIG. 11(D) is cut along a parting line.

FIG. 12 is a cross-sectional view in which a master laminated product 7 shown in FIG. 11(D) is divided along the sub-substrate parting line 44. FIG. 12 shows that the ceramic green sheet 47 overlaps both ends of the conductor film 43 and the central portion of the conductor film 43 is exposed through the opening 49 of the ceramic green sheet 47.

Figure 11E:
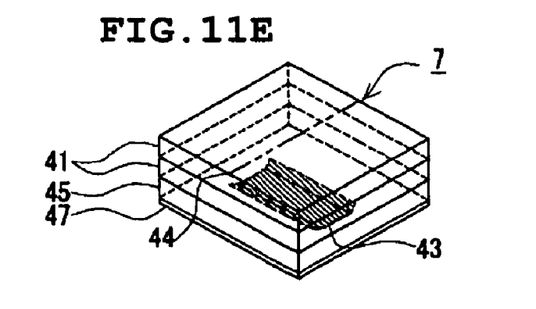
Figure 13:
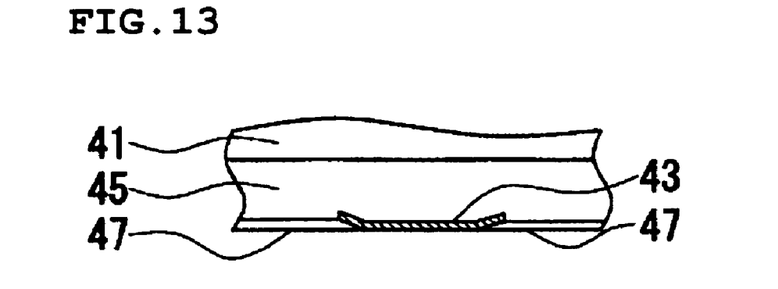
FIG. 13 is a cross-sectional view showing the state in which the master laminated product shown in FIG. 11(E) is cut along the parting line.

As shown in FIG. 11(E), all of the laminated ceramic green sheets are press bonded. FIG. 13 is a cross-sectional view in which the master laminated product 7 after the pressure bonding shown in FIG. 11(e) is cut along the sub-substrate parting line 44. FIG. 13 shows that both ends of the conductor film 43 are embedded toward the inside of the master laminated product 7 by the ceramic green sheet 47. In this step, the conductor film 43 has not been fired yet and is thus resilient. Therefore, the shape of the conductor film 43 is changed without breaking so as to tilt toward the inside of the master laminated product 7, and in addition, the remaining portion of the conductor film 43 is aligned at the lower surface of the ceramic green sheet 47.

The master laminated product 7 is fired and is then divided into two sub-substrates along the sub-substrate parting line 44 as in the first preferred embodiment. Thus, the sub-substrate shown in FIG. 9 is formed. When the sub-substrates are divided, the end surface of the conductor film 43 is exposed on the side surface of each sub-substrate. Both of the slanted end portions in the exposed surface form the first conductors 12 for appearance inspection.

Subsequently, electronic components such as a semiconductor device and a monolithic capacitor chip are mounted on the sub-substrate (ceramic multilayer substrate). Furthermore, for example, these electronic components are covered with a metal case so as to form the surface mount device 3.

In this preferred embodiment, although the first conductors 12 for appearance inspection are not completely perpendicular to the bottom surface of the ceramic multilayer substrate, these first conductors 12 for appearance inspection provide an example of a conductor having an upright rectangular shape. In other words, the degree of wetting of the solder in the upward direction can be easily distinguished by visual inspection as in the first preferred embodiment. Furthermore, the terminal electrode 13 is electrically connected to the two first conductors 12 for appearance inspection, which are disposed continuously at both ends of the terminal electrode 13, even in the inside of the ceramic multilayer substrate. In other words, the first conductors 12 for appearance inspection extend toward the inside of the ceramic multilayer substrate in the direction parallel to the bottom surface (first principal surface) of the ceramic multilayer substrate. As a result, the terminal electrode 13 is securely connected to the first conductors 12 for appearance inspection. This structure improves the connection reliability between the ceramic multilayer substrate and the terminal electrode 13 or the ceramic multilayer substrate and the first conductors 12 for appearance inspection.

Fourth Preferred Embodiment

Figure 14:
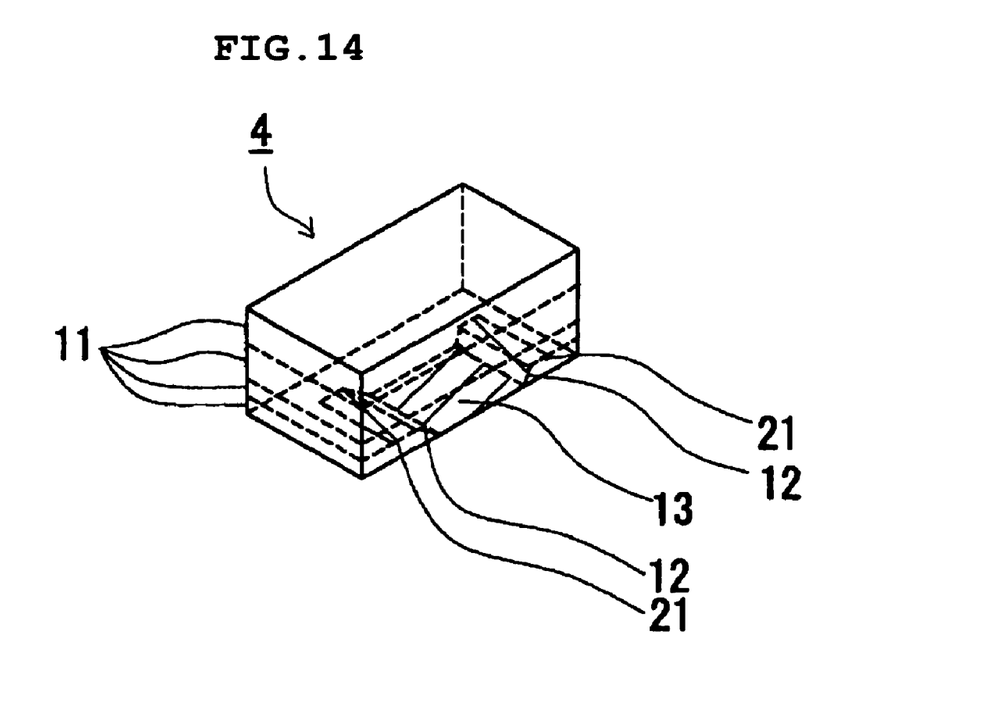
FIG. 14 is a perspective view showing another preferred embodiment of a surface mount device of the present invention.

FIG. 14 shows a modification of the third preferred embodiment and is a perspective view of a surface mount device of the present preferred embodiment. In the surface mount device 4 of this preferred embodiment, both ends (leading ends) of first conductors 12 for appearance inspection, which are slanted on the side surface of a ceramic multilayer substrate, are disposed in the direction substantially parallel to the bottom surface of the ceramic multilayer substrate. These ends define second conductors 18 for appearance inspection. A plated gold film is provided on the first and the second conductors 12 and 18 for appearance inspection as in the first preferred embodiment. Subsequently, the surface mount device 4 is mounted on a motherboard as in FIG. 2 in the first preferred embodiment described above.

Figure 15:
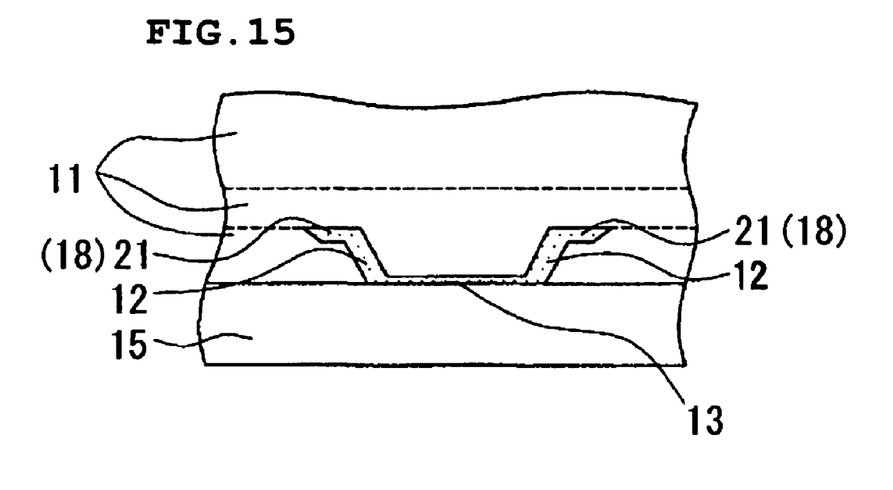
FIG. 15 is an enlarged side view of the relevant part of the surface mount device shown in FIG. 14 after the surface mount device is mounted on a motherboard.

FIG. 15 is an enlarged view of the surface mount device 4 after the surface mount device 4 is mounted on a motherboard 15, visually viewed from the side surface on which the first and the second conductors 12 and 18 for appearance inspection are provided. A suitably large conductor film 43 is formed as in the process for producing the surface mount device in the third preferred embodiment described above. As a result, as shown in FIG. 15, the first and the second conductors 12 and 18 for appearance inspection are arranged such that all the conductors are not evenly slanted but both ends 21 are substantially parallel to the bottom surface. When the surface mount device 3 shown in FIG. 10 is compared with the surface mount device 4 shown in FIG. 15, the degree of wetting of the solder in the upward direction is more accurately visually distinguished in the surface mount device 4 because the shape of the first conductors 12 for appearance inspection in FIG. 15 includes portions extending in the horizontal direction (the direction parallel to the bottom surface).

The conductor for appearance inspection described in the above preferred embodiments is preferably disposed at all the terminal electrodes that are soldered with a mount board. However, the conductor for appearance inspection may be disposed at a portion of the terminal electrodes that is important for the mounting, for example, only at the terminal electrodes disposed at four corners of a surface mount device.

The present invention is preferably used in surface mount devices, such as electronic components, that are mounted on a wiring board such as a motherboard.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

The invention claimed is:

1. A surface mountable device comprising;
   a substrate including a first principal surface, a second principal surface, and a side surface connecting the first principal surface to the second principal surface;
   a terminal electrode disposed on the first principal surface; and
   a first conductor for appearance inspection extending continuously from the terminal electrode to the side surface and having a width less than a width of the terminal electrode; wherein
   the terminal electrode is arranged to be directly connected to a land on a mother board via solder; and
   the first conductor for appearance inspection is arranged such that the solder connecting the terminal electrode to the land extends from the terminal electrode onto the first conductor for appearance inspection.

2. The surface mountable device according to claim 1, further comprising a second conductor for appearance inspection disposed on the side surface of the substrate, the second conductor for appearance inspection being arranged to be continuous from an extended end of the first conductor for appearance inspection.

3. The surface mountable device according to claim 2, wherein the second conductor for appearance inspection extends in a direction that is substantially perpendicular to the first conductor for appearance inspection.

4. The surface mountable device according to claim 2, wherein the first conductor for appearance inspection and the second conductor for appearance inspection are arranged in a T shape.

5. The surface mountable device according to claim 2, wherein a dimension of the second conductor for appearance inspection in a horizontal direction is about 100 µm to about 300 µm.

6. The surface mountable device according to claim 1, wherein a width of the first conductor for appearance inspection is about 100 µm or less.

7. The surface mountable device according to claim 1, wherein a height of the first conductor for appearance inspection is about 100 µm.

8. The surface mountable device according to claim 1, wherein the first conductor for appearance inspection extends from the terminal electrode to the inside of the substrate.

9. The surface mountable device according to claim 1, wherein at least two first conductors for appearance inspection are disposed continuously at the terminal electrode.

10. The surface mountable device according to claim 5, wherein said at least two first conductors for appearance inspection are disposed continuously at both ends of the terminal electrode.

11. The surface mountable device according to claim 10, wherein said at least two first conductors extend upward from both ends of the terminal electrode at an oblique angle with respect to the terminal electrode.

12. The surface mountable device according to claim 10, further comprising at least two second conductors for appearance inspection disposed on the side surface of the substrate, the at least two second conductors for appearance inspection being continuous from the extended ends of the at least two first conductors for appearance inspection.

13. The surface mountable device according to claim 12, wherein said at least two second conductors for appearance inspection extend in a substantially horizontal direction.

14. The surface mountable device according to claim 1, wherein a gold plating is disposed on said first conductor for appearance inspection.

15. The surface mountable device according to claim 1, wherein a gold plating is disposed on said terminal electrode.

16. The surface mountable device according to claim 1, wherein a gold plating is disposed on said first conductor for appearance inspection and said terminal electrode.

* * * * *